(12) United States Patent
Shibayama

(10) Patent No.: US 9,880,975 B2
(45) Date of Patent: Jan. 30, 2018

(54) DIGITAL FILTER DEVICE, DIGITAL FILTER PROCESSING METHOD, AND STORAGE MEDIUM HAVING DIGITAL FILTER PROGRAM STORED THEREON

(71) Applicant: NEC Corporation, Minato-ku, Tokyo (JP)

(72) Inventor: Atsufumi Shibayama, Tokyo (JP)

(73) Assignee: NEC CORPORATION, Tokyo (JP)

( * ) Notice: Subject to any disclaimer, the term of this patent is extended or adjusted under 35 U.S.C. 154(b) by 49 days.

(21) Appl. No.: 15/103,112

(22) PCT Filed: Nov. 19, 2014

(86) PCT No.: PCT/JP2014/005802
§ 371 (c)(1),
(2) Date: Jun. 9, 2016

(87) PCT Pub. No.: WO2015/087495
PCT Pub. Date: Jun. 18, 2015

(65) Prior Publication Data
US 2016/0357705 A1    Dec. 8, 2016

(30) Foreign Application Priority Data

Dec. 13, 2013   (JP) .................................. 2013-258272

(51) Int. Cl.
*G06F 17/10* (2006.01)
*G06F 17/14* (2006.01)
(Continued)

(52) U.S. Cl.
CPC ........ *G06F 17/142* (2013.01); *G06F 11/0721* (2013.01); *G06F 11/0751* (2013.01); *H03H 17/0213* (2013.01)

(58) Field of Classification Search
None
See application file for complete search history.

(56) References Cited

U.S. PATENT DOCUMENTS

| | | | |
|---|---|---|---|
| 9,281,801 B2 * | 3/2016 | Shibayama | ........ H03H 17/0213 |
| 2006/0031276 A1 * | 2/2006 | Kumamoto | ........... G06F 17/142 |
| | | | 708/403 |

(Continued)

FOREIGN PATENT DOCUMENTS

| | | |
|---|---|---|
| JP | H08-131832 A | 5/1996 |
| JP | 2001-056806 A | 2/2001 |

(Continued)

OTHER PUBLICATIONS

J. W. Cooley, J. W. Tukey, "An Algorithm for the Machine Calculation of Complex Fourier Series," Mathematics of Calculation, US, American Mathematical Society, Apr. 1965, vol. 19, No. 90, pp. 297-301 English Abstract Cited in the Specification.

(Continued)

*Primary Examiner* — David H Malzahn

(57) ABSTRACT

Provided is a digital filter device that causes the last data of an immediately precedent input block to overlap with the input block of a time domain and generates an overlap block. The overlap block and the immediately precedent input block are each converted into a frequency domain block, subjected to filter processing, and converted into first and second time domain blocks. Among the overlap section of the first time domain block and the second time domain block, the front-end data of the first time domain block and the rear-end data of the temporal axis of the second time domain block are removed as a section of data that is to be removed, and output data is generated. An overlap amount is controlled on the basis of a distortion amount that is determined by comparing the removed section of the data of the first time region domain with the output section of the data of the overlap section of the second time domain block other than the removed section of said overlap section.

6 Claims, 9 Drawing Sheets

(51) Int. Cl.
*H03H 17/02* (2006.01)
*G06F 11/07* (2006.01)

(56) References Cited

U.S. PATENT DOCUMENTS

| | | | | | |
|---|---|---|---|---|---|
| 2013/0262545 | A1* | 10/2013 | Shibayama | ........ | H03H 17/0248 708/300 |
| 2016/0140083 | A1* | 5/2016 | Shibayama | ........... | G06F 17/142 708/300 |
| 2016/0357705 | A1* | 12/2016 | Shibayama | ........... | G06F 17/142 |

FOREIGN PATENT DOCUMENTS

| | | | |
|---|---|---|---|
| JP | 2006-304192 | A | 11/2006 |
| JP | 2008-506191 | A | 2/2008 |
| JP | 2010-130355 | A | 6/2010 |
| JP | 2012-022500 | A | 2/2012 |
| WO | 2012/086262 | A1 | 6/2012 |

OTHER PUBLICATIONS

D. P. Kolba, "A Prime Factor FFT Algorithm Using High-Speed Convolution," IEEE Trans. on Acoustics, US, IEEE Signal Processing Society, Aug. 1977, vol. 29, No. 4, pp. 281-294 English Abstract Cited in the Specification.

International Search Report for PCT Application No. PCT/JP2014/005802, dated Feb. 17, 2015.

English translation of Written opinion for PCT Application No. PCT/JP2014/005802.

\* cited by examiner

Fig. 3

| | | ps(0) | ps(1) | ps(2) | ps(3) | ps(4) | ps(5) | ps(6) | ps(7) |
|---|---|---|---|---|---|---|---|---|---|
| CYCLE 1 | P1 | 0 | 1 | 2 | 3 | 4 | 5 | 6 | 7 |
| 2 | P2 | 8 | 9 | 10 | 11 | 12 | 13 | 14 | 15 |
| 3 | P3 | 16 | 17 | 18 | 19 | 20 | 21 | 22 | 23 |
| 4 | P4 | 24 | 25 | 26 | 27 | 28 | 29 | 30 | 31 |
| 5 | P5 | 32 | 33 | 34 | 35 | 36 | 37 | 38 | 39 |
| 6 | P6 | 40 | 41 | 42 | 43 | 44 | 45 | 46 | 47 |
| 7 | P7 | 48 | 49 | 50 | 51 | 52 | 53 | 54 | 55 |
| 8 | P8 | 56 | 57 | 58 | 59 | 60 | 61 | 62 | 63 |

Fig. 4

|  | qs(0) | qs(1) | qs(2) | qs(3) | qs(4) | qs(5) | qs(6) | qs(7) |
|---|---|---|---|---|---|---|---|---|
| Q1 | 0 | 8 | 16 | 24 | 32 | 40 | 48 | 56 |
| Q2 | 1 | 9 | 17 | 25 | 33 | 41 | 49 | 57 |
| Q3 | 2 | 10 | 18 | 26 | 34 | 42 | 50 | 58 |
| Q4 | 3 | 11 | 19 | 27 | 35 | 43 | 51 | 59 |
| Q5 | 4 | 12 | 20 | 28 | 36 | 44 | 52 | 60 |
| Q6 | 5 | 13 | 21 | 29 | 37 | 45 | 53 | 61 |
| Q7 | 6 | 14 | 22 | 30 | 38 | 46 | 54 | 62 |
| Q8 | 7 | 15 | 23 | 31 | 39 | 47 | 55 | 63 |

CYCLE → 1 2 3 4 5 6 7 8

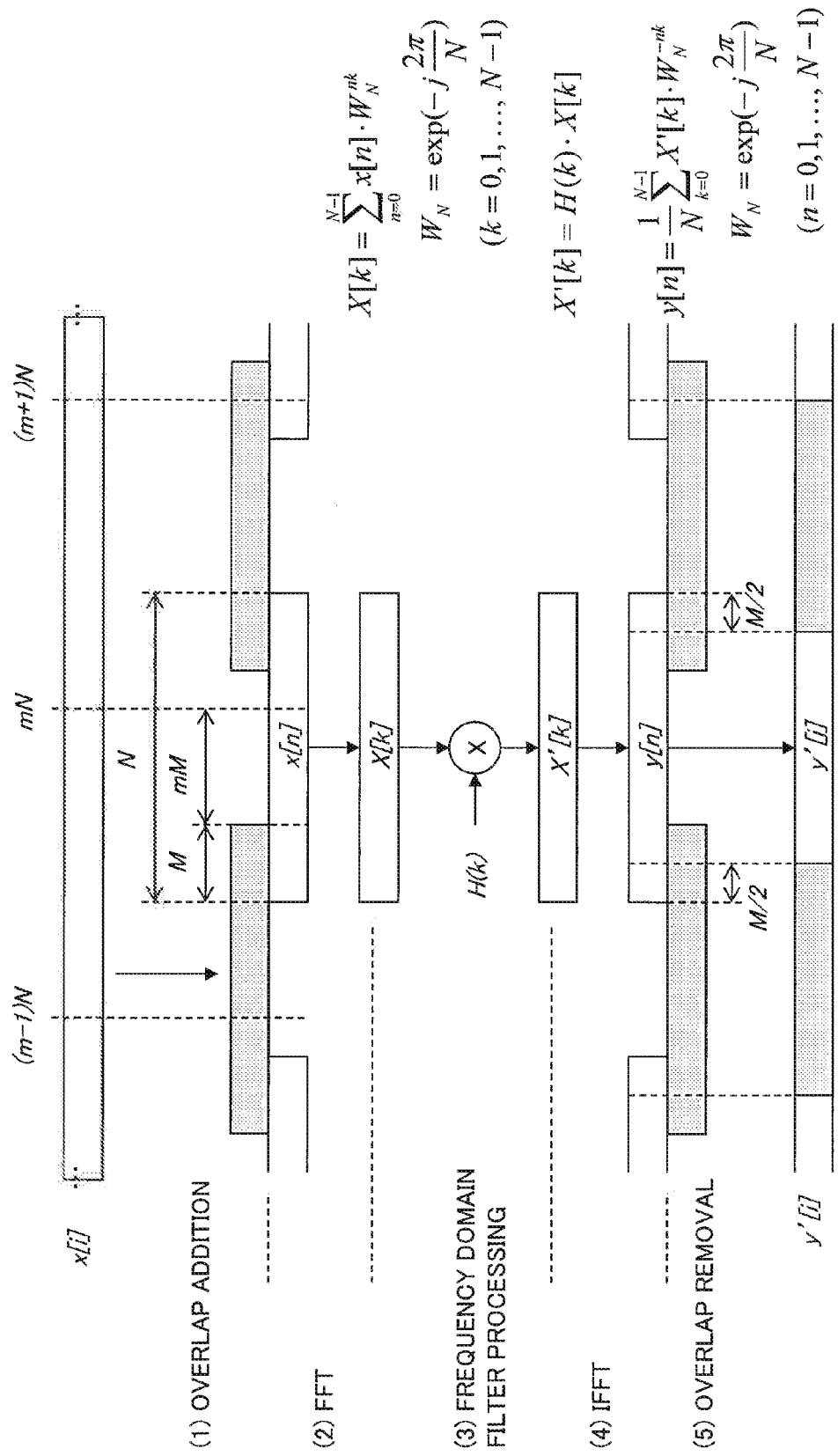

US 9,880,975 B2

DIGITAL FILTER DEVICE, DIGITAL FILTER PROCESSING METHOD, AND STORAGE MEDIUM HAVING DIGITAL FILTER PROGRAM STORED THEREON

This application is a National Stage Entry of PCT/JP2014/005802 filed on Nov. 19, 2014, which claims priority from Japanese Patent Application 2013-258272 filed on Dec. 13, 2013, the contents of all of which are incorporated herein by reference, in their entirety.

TECHNICAL FIELD

The present invention relates to calculation processing in digital signal processing, and more particularly to a digital filter device, a digital filter processing method, and a storage medium having a digital filter program stored thereon.

BACKGROUND ART

Important processing types in digital signal processing include fast Fourier transform (hereinafter referred to as "FFT") processing. Further, as a technology of compensating for waveform distortion in signal transmission in wireless communication and wired communication, for example, a frequency domain equalization (FDE) technology is known. In frequency domain equalization, signal data in a time domain are first transformed into data in a frequency domain by a fast Fourier transform, and next, filter processing for equalization is performed. Then, data after the filter processing are retransformed into signal data in a time domain by inverse fast Fourier transform (hereinafter referred to as "IFFT") so that waveform distortion in the original signal in a time domain is compensated for. FFT and IFFT are hereinafter referred to as "FFT/IFFT" when they are not distinguished.

In general, "butterfly calculation" is used in FFT/IFFT processing. An FFT device using butterfly calculation is described in, for example, PTL 1. PTL 1 also describes "twiddle multiplication" to be described later, that is, multiplication using a twiddle coefficient.

As an efficient FFT/IFFT processing method, for example, butterfly calculation by Cooley-Tukey described in NPL 1 is well known. However, the FFT/IFFT processing method by Cooley-Tukey has a large number of points and therefore a circuit for providing the processing method is complex. Consequently, FFT/IFFT processing is performed by breaking down an FFT/IFFT into two smaller-sized FFT/IFFTs by use of, for example, a prime factor method described in NPL 2.

FIG. 7 illustrates, for example, a data flow 500 of a 64-point FFT broken down into sets of two-stage radix-8 butterfly processing by use of the prime factor method. The data flow 500 includes data sorting processing 501, a total of 16 sets of radix-8 butterfly calculation processing composed of butterfly calculation processing 502 and 503, and twiddle multiplication processing 504.

In the data flow illustrated in FIG. 7, input time-domain data x(n) (n=0, 1, ..., 63) are Fourier-transformed into a frequency-domain signal X(k) (k=0, 1, ..., 63) by FFT processing. In the example illustrated in FIG. 7, illustration of part of the data flow is omitted. Note that a basic configuration of the data flow illustrated in FIG. 7 is the same for IFFT processing.

When a number of points of an FFT is large, an enormous circuit scale is required in order to provide the entire data flow illustrated in FIG. 7 by a circuit. Consequently, when a number of points of an FFT is large, a method of providing the entire FFT processing by repetitive use of a circuit providing part of the processing of the data flow, depending on required processing performance, is common.

For example, in the data flow illustrated in FIG. 7, when an FFT device performing FFT processing on eight pieces of data in parallel (hereinafter simply referred to as "in 8-data-parallel") is created as a physical circuit, 64-point FFT processing can be provided by a total of eight sets of repetitive processing.

The eight sets of repetitive processing represent successively performing processing corresponding to each of partial data flows 505a to 505h performed on eight pieces of data, and are specifically performed as follows. That is, processing corresponding to the partial data flow 505a is performed in a first round, processing corresponding to the partial data flow 505b is performed in a second round, and processing corresponding to the partial data flow 505c (not illustrated) is performed in a third round. Thereafter, processing is successively performed in a similar manner up to processing corresponding to the partial data flow 505h in an eighth round. The processing described above provides the 64-point FFT processing.

In butterfly calculation, data arranged in sequential order are read in an order conforming to a predetermined rule, and processed. Thus, data sorting is required in butterfly calculation, and a random access memory (RAM) is used for the purpose. An FFT device performing data sorting using a RAM in butterfly calculation is described in, for example, PTL 2.

Further, as for an FFT calculation device with a reduced memory usage amount, an acceleration technology by parallel processing of butterfly calculation is described in, for example, PTL 3.

Meanwhile, in FFT, it is assumed that data identical with a range of an extracted input signal being a processing target, that is, a set of consecutive input data (hereinafter referred to as "processing block") are periodically repeated. However, an actual signal is not necessarily a periodic signal, and therefore there is a problem that calculation distortion occurs near both ends of a processing block after FFT.

As a technology solving the problem, for example, an "overlap method" may be cited. In the overlap method, adjacent processing blocks are overlapped by a predetermined number of pieces of data, and FFT processing is performed. Data after FFT processing undergo filter processing and then retransformed into a time-domain signal by IFFT processing. Then, partial data at both ends where calculation distortion occurs in an overlapped processing block are removed. A part of processing block data to be removed is hereinafter referred to as "removal part" and a part not removed but output is referred to as "output part."

The overlap method is also applied to FDE (refer to, for example, PTL 4 and 5). An overlap FDE method in which the overlap method is applied to FDE will be described. FIG. 8 is a block diagram illustrating a configuration example of a digital filter circuit 700 by the overlap FDE method. The digital filter circuit 700 is a frequency-domain filter circuit performing filter processing in a frequency domain. Specifically, a time-domain signal input as input data is transformed into frequency-domain data by FFT and subsequently undergoes filter processing. Then, the signal after the filter processing is retransformed into a time-domain signal by IFFT and output as an output signal.

The digital filter circuit 700 includes an overlap addition circuit 710, an FFT circuit 711, a filter calculation circuit 712, an IFFT circuit 713, and an overlap removal circuit 714.

The overlap addition circuit 710 successively generates a block composed of N pieces of data (where N is a positive integer) from input data which is a time-domain input signal, and outputs the block to the FFT circuit 711. At this time, the overlap addition circuit 710 causes each block to have M pieces of data (where M is a positive integer) overlapped with an immediately preceding block. The number of pieces of data to be overlapped M is hereinafter referred to as "overlap amount." Further, an overlapped part in each block is referred to as "overlap part."

An overlap amount M may be a predetermined fixed value. In that case, the overlap addition circuit 710 and the overlap removal circuit 714 are configured in accordance with a value of the overlap value M. Alternatively, for example, the overlap addition circuit 710 and the overlap removal circuit 714 may refer to a set value of an overlap amount M given by an upper circuit (not illustrated) such as a central processing unit (CPU) and set the value when in operation. Note that the overlap addition circuit 710 may be configured by, for example, a dual-port memory.

The FFT circuit 711 performs FFT on a time-domain input signal with M pieces of data overlapped thereon, being output from the overlap addition circuit 710, transforms the signal into a frequency-domain signal, and outputs the signal to the filter calculation circuit 712.

The filter calculation circuit 712 performs filter processing on a frequency-domain signal transformed by the FFT circuit 711, and outputs the signal to the IFFT circuit 713. For example, when the digital filter circuit 700 performs processing of equalizing signal distortion in a communication channel, the filter calculation circuit 712 may be configured with a complex number multiplier.

The IFFT circuit 713 performs IFFT on a frequency-domain signal after filter processing, output from the filter calculation circuit 712, to retransform the signal into a time-domain signal, and outputs the signal to the overlap removal circuit 714.

The overlap removal circuit 714 removes a total of M pieces of data from both ends of each block composed of N pieces of data which is a time-domain signal retransformed by the IFFT circuit 713. At this time, a part to be removed is the aforementioned "removal part" and the amount of the data is equal to the overlap amount M. Then, the overlap removal circuit 714 outputs data in an "output part" included in an overlap part and data in a middle part of a block not overlapped as output data.

An operation of the digital filter circuit 700 illustrated in FIG. 8 will be described below with reference to FIG. 9. FIG. 9 is an operation diagram illustrating an operation example of the digital filter circuit illustrated in FIG. 8. In the description below, processing steps (1) to (5) respectively correspond to processing steps (1) to (5) in FIG. 9.

(1) Overlap Addition Processing

The overlap addition circuit 710 successively generates a block composed of N pieces of data (where N is a positive integer) from input data which is a time domain input signal. At this time, the overlap addition circuit 710 causes the block to have M pieces of data overlapped with an immediately preceding block.

When input data are denoted as $x(i)(i=0,1,\ldots)$, a block composed of N pieces of data is expressed as $x(j)(j=m(N-M)-N$ to $m(N-M)-1$, where $m$ is a positive integer).

Note that N denotes an FFT block size and M denotes an overlap amount.

(2) FFT Processing

The FFT circuit 711 performs FFT on a block composed of time-domain signal data, and transforms the block into a block composed of frequency-domain signal data.

Again, when a block composed of N pieces of time-domain signal data is denoted as $x(n)(n=0,1,\ldots,N-1)$, a block in a frequency domain after the FFT processing is given by $X(k)(k=0,1,\ldots,N-1)$.

(3) Frequency Domain Filter Processing

The filter calculation circuit 712 performs filter processing on each piece of signal data in a frequency domain, composing a block after FFT processing.

A block after the filter processing corresponding to a block X(k) before the filter processing is given by $X'(k)=H(k)\cdot X(k)(k=0,1,\ldots,N-1)$.

Note that H(k) denotes a filter coefficient.

(4) IFFT Processing

The IFFT circuit 713 performs IFFT on a block composed of frequency-domain signal data after filter processing to retransform the block into a block composed of time-domain signal data.

A block after the IFFT processing corresponding to a block X'(k) before the IFFT processing is given by $y(n)(n=0,1,\ldots,N-1)$.

(5) Overlap Removal Processing

From the block y(n) composed of N pieces of signal data after the IFFT processing, the overlap removal circuit 714 extracts a middle part by removing M/2 pieces of overlapped data from the start and the end of the block, respectively, that is, data in a removal part.

Thus, data in the removal part are removed, and a sequence of (N−M) pieces of signal data composed of an output part included in an overlap part of the block y(n) and the middle part not overlapped, expressed as $y'(j)(j=M/2$ to $(N-1)-M/2)$, is generated.

There exists a digital filter circuit using overlap processing for general filter processing, not being limited to FDE and the like (refer to, for example, PTL 6). The digital filter circuit in PTL 6 also performs overlap addition processing, FFT processing, frequency domain filter processing, IFFT processing, and overlap removal processing.

Meanwhile, an overlap amount required in a filter using overlap processing is determined in accordance with an impulse response length of executed filter processing. Additionally, a size of an FFT processing block needs to be greater than the required overlap amount. Consequently, a size of the FFT processing block is determined in accordance with an impulse response length of the filter processing.

There is a technology of decreasing a hardware amount of a processing device performing FFT on blocks with varying sizes (refer to, for example, PTL 7). An orthogonal transformation processor in PTL 7 determines a memory size adapting to a length of an FFT vector (corresponding to "processing block"), disables an unnecessary circuit block, and operates hardware in a time-division manner.

CITATION LIST

Patent Literature

[PTL 1] Japanese Unexamined Patent Application Publication No. H8-137832 (pp. 3-5, FIG. 25)

[PTL 2] Japanese Unexamined Patent Application Publication No. 2001-56806 (p. 5, FIG. 1)
[PTL 3] Japanese Unexamined Patent Application Publication No. 2012-22500 (p. 5, FIG. 1)
[PTL 4] Japanese Unexamined Patent Application Publication No. 2006-304192 (pp. 4-5, FIG. 4)
[PTL 5] Japanese Unexamined Patent Application Publication No. 2010-130355 (pp. 3-6, FIG. 6)
[PTL 6] International Application Publication No. WO 2012/086262 (pp. 3-4, FIG. 1)
[PTL 7] Japanese Translation of PCT International Application Publication No. 2008-506191 (pp. 11-12, FIGS. 11 and 12)

Non Patent Literature

[NPL 1] J. W. Cooley, J. W. Tukey, "An Algorithm for the Machine Calculation of Complex Fourier Series," Mathematics of Calculation, US, American Mathematical Society, April 1965, Vol. 19, No. 90, pp. 297-301
[NPL 2] D. P. Kolba, "A Prime Factor FFT Algorithm Using High-Speed Convolution," IEEE Trans. on Acoustics, US, IEEE Signal Processing Society, August 1977, Vol. 29, No. 4, pp. 281-294

SUMMARY OF INVENTION

Technical Problem

As described above, a size of an FFT processing block depends on an impulse response length of filter processing. Thus, as an impulse response length becomes greater, a required overlap amount and an FFT processing block also become greater. Consequently, there is a problem that a circuit scale required for the processing and power consumption increase.

Thus, in general, when using FFT with filter processing in a frequency domain and additionally using overlap processing, a circuit scale required for the processing and power consumption become greater as an impulse response length of a filter becomes greater. Therefore, it is preferred to optimize a scale of an operating circuit, in accordance with a filter characteristic, and minimize power consumption.

However, the FFT devices described in PTL 1 to 3 and NPL 1 and 2 do not particularly perform control such as optimization of a scale of an operating circuit and power consumption control, adapting to a processing block change.

Further, the filter methods using overlap described in PTL 4 to 6 do not perform processing focusing on an impulse response of a filter. Therefore, the methods described in PTL 4 to 6 are not able to solve the abovementioned problem, either.

While the orthogonal transformation processor in PTL 7 determines a memory size, disables an unnecessary circuit block, and operates hardware in a time-division manner, sorting processing in FFT/IFFT processing itself is required. In general, sorting processing requires a memory with capacity capable of storing all data in a processing block. Consequently, when an impulse response length of filter processing is large and a size of a processing block is large, there is a problem that a large-scale memory is required and a circuit scale required for the processing and power consumption increase.

Object of Invention

An object of the present invention is to provide a digital filter device, a digital filter processing method, and a storage medium having a digital filter program stored thereon, capable of reducing power consumption when using FFT with filter processing in a frequency domain.

Solution to Problem

A digital filter device, according to the present invention, comprises:
overlap addition means for adding an overlap amount which is last M consecutive pieces of data in a second input block including N consecutive pieces of time-domain input data immediately preceding a first input block to the first input block including (N−M) consecutive pieces of time-domain input data (where N is a positive integer and M is a positive integer less than N), to generate an overlap block;
Fourier transform means for transforming the overlap block and the second input block into a first frequency-domain block and a second frequency-domain block in a frequency domain, respectively, by fast Fourier transform processing;
filter calculation means for performing filter processing on the first frequency-domain block and the second frequency-domain block, to generate a first after-processing block and a second after-processing block, respectively;
inverse Fourier transform means for transforming the first after-processing block and the second after-processing block into a first time-domain block and a second time-domain block in a time domain, respectively, by inverse fast Fourier transform processing;
overlap removal means for, out of an overlap part in which each of the first time-domain block and the second time-domain block overlaps temporally, removing k pieces of data (where k is a positive integer less than M) at a front end of a time axis of the first time-domain block and (M−k) pieces of data at a rear end of a time axis of the second time-domain block as removal part data, to generate output data; and
overlap error detection means for comparing the removal part data in the first time-domain block with output part data other than the removal part data in the overlap part in the second time-domain block, to detect a distortion amount caused by data included in the overlap part, and controlling the overlap amount, in accordance with the distortion amount.

A digital filter processing method, according to the present invention, comprises:
adding an overlap amount which is last M consecutive pieces of data in a second input block including N consecutive pieces of time-domain input data immediately preceding a first input block to the first input block including (N−M) consecutive pieces of time-domain input data (where N is a positive integer and M is a positive integer less than N), to generate an overlap block;
transforming the overlap block and the second input block into a first frequency-domain block and a second frequency-domain block in a frequency domain, respectively, by fast Fourier transform processing;
performing filter processing on the first frequency-domain block and the second frequency-domain block, to generate a first after-processing block and a second after-processing block, respectively;
transforming the first after-processing block and the second after-processing block into a first time-domain block and a second time-domain block in a time domain, respectively, by inverse fast Fourier transform processing;
out of an overlap part in which each of the first time-domain block and the second time-domain block overlaps temporally, removing k pieces of data (where k is a positive integer less than M) at a front end of a time axis of the first time-domain block and (M−k) pieces of data at a rear end of a time axis of the second time-domain block as removal part data, to generate output data; and comparing the removal part data in the first time-domain block with output part data other than the removal part data in the overlap part in the second time-domain block, to detect a distortion amount caused by data included in the overlap part, and controlling the overlap amount, in accordance with the distortion amount.

A digital filter program stored on a storage medium, according to the present invention, causes a computer included in a digital filter device to function as:

overlap addition means for adding an overlap amount which is last M consecutive pieces of data in a second input block including N consecutive pieces of time-domain input data immediately preceding a first input block to the first input block including (N−M) consecutive pieces of time-domain input data (where N is a positive integer and M is a positive integer less than N), to generate an overlap block;

Fourier transform means for transforming the overlap block and the second input block into a first frequency-domain block and a second frequency-domain block in a frequency domain, respectively, by fast Fourier transform processing;

filter calculation means for performing filter processing on the first frequency-domain block and the second frequency-domain block, to generate a first after-processing block and a second after-processing block, respectively;

inverse Fourier transform means for transforming the first after-processing block and the second after-processing block into a first time-domain block and a second time-domain block in a time domain, respectively, by inverse fast Fourier transform processing;

overlap removal means for, out of an overlap part in which each of the first time-domain block and the second time-domain block overlaps temporally, removing k pieces of data (where k is a positive integer less than M) at a front end of a time axis of the first time-domain block and (M−k) pieces of data at a rear end of a time axis of the second time-domain block as removal part data, to generate output data; and overlap error detection means for comparing the removal part data in the first time-domain block with output part data other than the removal part data in the overlap part in the second time-domain block, to detect a distortion amount caused by data included in the overlap part, and controlling the overlap amount, in accordance with the distortion amount.

Advantageous Effects of Invention

The present invention is able to reduce power consumption when using FFT with filter processing in a frequency domain.

BRIEF DESCRIPTION OF DRAWINGS

FIG. 3 is a diagram illustrating an arrangement of data sets conforming to a sequential order according to the exemplary embodiment of the present invention.

FIG. 4 is a diagram illustrating an arrangement of data sets conforming to a bit-reversed order according to the exemplary embodiment of the present invention.

FIG. 9 is an operation diagram illustrating an operation example of a digital filter circuit by an overlap FDE method.

DESCRIPTION OF EMBODIMENTS

First Exemplary Embodiment

Figure 1:
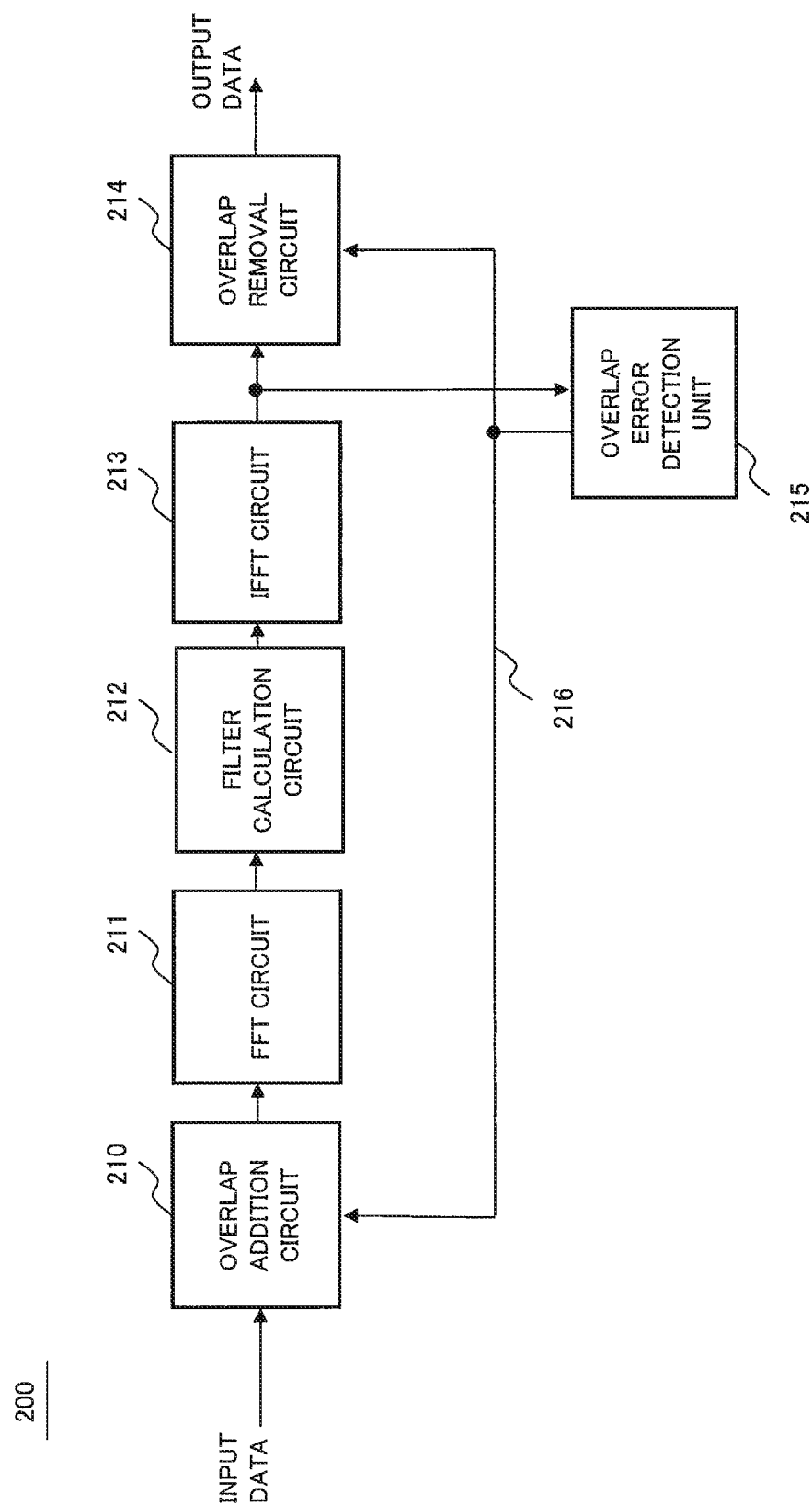
FIG. 1 is a block diagram illustrating a configuration of a digital filter circuit 200 according to an exemplary embodiment of the present invention.

Next, an exemplary embodiment of the present invention will be described in detail with reference to the drawings. FIG. 1 is a block diagram illustrating a configuration example of a digital filter circuit 200 according to the exemplary embodiment of the present invention.

The digital filter circuit 200 performs filter processing such as FDE by an overlap method. The digital filter circuit 200 includes an overlap addition circuit 210, an FFT circuit 211, a filter calculation circuit 212, an IFFT circuit 213, an overlap removal circuit 214, and an overlap error detection unit 215.

The overlap addition circuit 210 successively generates an input block composed of consecutive N pieces of data (where N is a positive integer) from input data which is a time-domain input signal, and outputs the block to the FFT circuit 211. At this time, the overlap addition circuit 210 causes each input block to overlap last M pieces of data (where M is a positive integer) in an immediately preceding block. "Overlap" refers to causing leading predetermined X pieces of data (where X is a positive integer) in each input block to be identical with last X pieces of data in an immediately preceding block so that the two blocks include overlapped X pieces of data. The overlap addition circuit 210 generates an "overlap block" composed of consecutive N pieces of data including overlapped M pieces of data. Note that the overlap addition circuit 210 may be configured with, for example, a dual-port memory.

The FFT circuit 211 performs an N-point fast Fourier transform (FFT) on an overlap block output from the overlap addition circuit 210 to transform the block into a frequency-domain signal. Then, the FFT circuit 211 outputs a "frequency-domain block" composed of N pieces of frequency-domain data to the filter calculation circuit 212.

The filter calculation circuit 212 performs filter processing on a frequency-domain block output from the FFT circuit 211, and outputs an "after-processing block" to the IFFT circuit 213. For example, when the digital filter circuit 200 performs equalization processing of signal distortion in a communication channel, that is, FDE, the filter calculation circuit 212 may be configured with a complex number multiplier.

The IFFT circuit 213 performs an N-point inverse fast Fourier transform (IFFT) on an after-processing block output from the filter calculation circuit 212 to retransform the block into a time domain signal. Then, the IFFT circuit 213 outputs a "time-domain block" composed of N pieces of time-domain data to the overlap removal circuit 214.

The overlap removal circuit 214 removes a total of M pieces of "removal part data" from both ends of the time axis of each time-domain block output from the IFFT circuit 213. Then, the overlap removal circuit 214 extracts only "output part data" in an overlap part of the time-domain block and a middle part not overlapped, and outputs the extracted data as "output data."

An overlap amount M is set to a predetermined value in advance. Then, the overlap amount M is updated to a proper value by an overlap amount determination unit 222 as described below. The overlap addition circuit 210 and the overlap removal circuit 214 respectively adds or removes an overlap, in accordance with the overlap amount M at the time. Note that an overlap amount M is less than an FFT block size N.

The overlap error detection unit 215 detects a distortion amount of an overlap part by comparing values of removal part data, to be eventually removed, in an overlap part of two consecutive FFT blocks with values of output part data output without being removed. The reason that the distortion amount of the overlap part is detected by the comparison is that data in the output part have normal values not causing distortion while data in the removal part may cause distortion.

The overlap amount determination unit 222 increases the overlap amount M when the detected distortion amount is greater than a predetermined value. The overlap amount determination unit 222 decreases the overlap amount M when the detected distortion amount is less than a predetermined value. For that purpose, the overlap amount determination unit 222 outputs a control signal 216 instructing increase or decrease of the overlap amount to the overlap addition circuit 210 and the overlap removal circuit 214.

Next, a configuration of the FFT circuit 211 included in the digital filter circuit 200 will be described.

Figure 2:
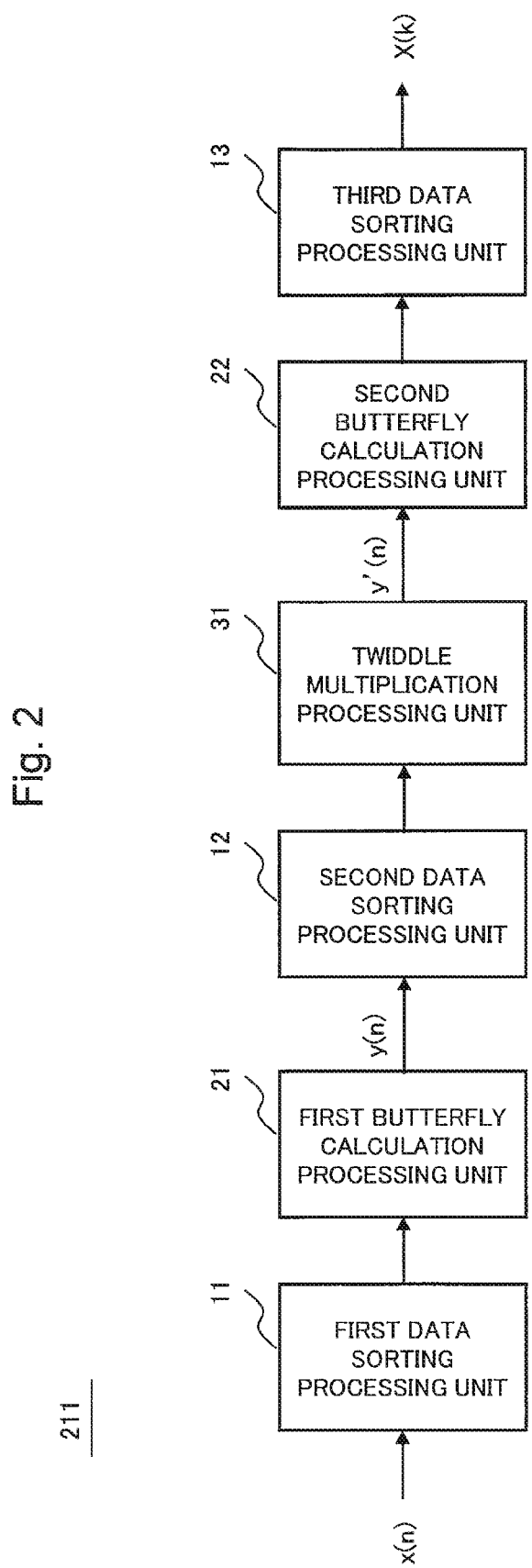
FIG. 2 is a block diagram illustrating a configuration of an FFT circuit 211 according to the exemplary embodiment of the present invention.

FIG. 2 is a block diagram illustrating a configuration example of the FFT circuit 211 according to the exemplary embodiment of the present invention. The FFT circuit 211 processes a 64-point FFT broken down into sets of two-stage radix-8 butterfly processing, in accordance with the data flow 500 illustrated in FIG. 7, by a pipeline circuit method. The FFT circuit 211 inputs time-domain data x(n) (n=0, 1, ..., 63), and Fourier-transforms x(n) by FFT processing to generate and output a frequency-domain signal X(k) (k=0, 1, ..., 63).

Figure 7:
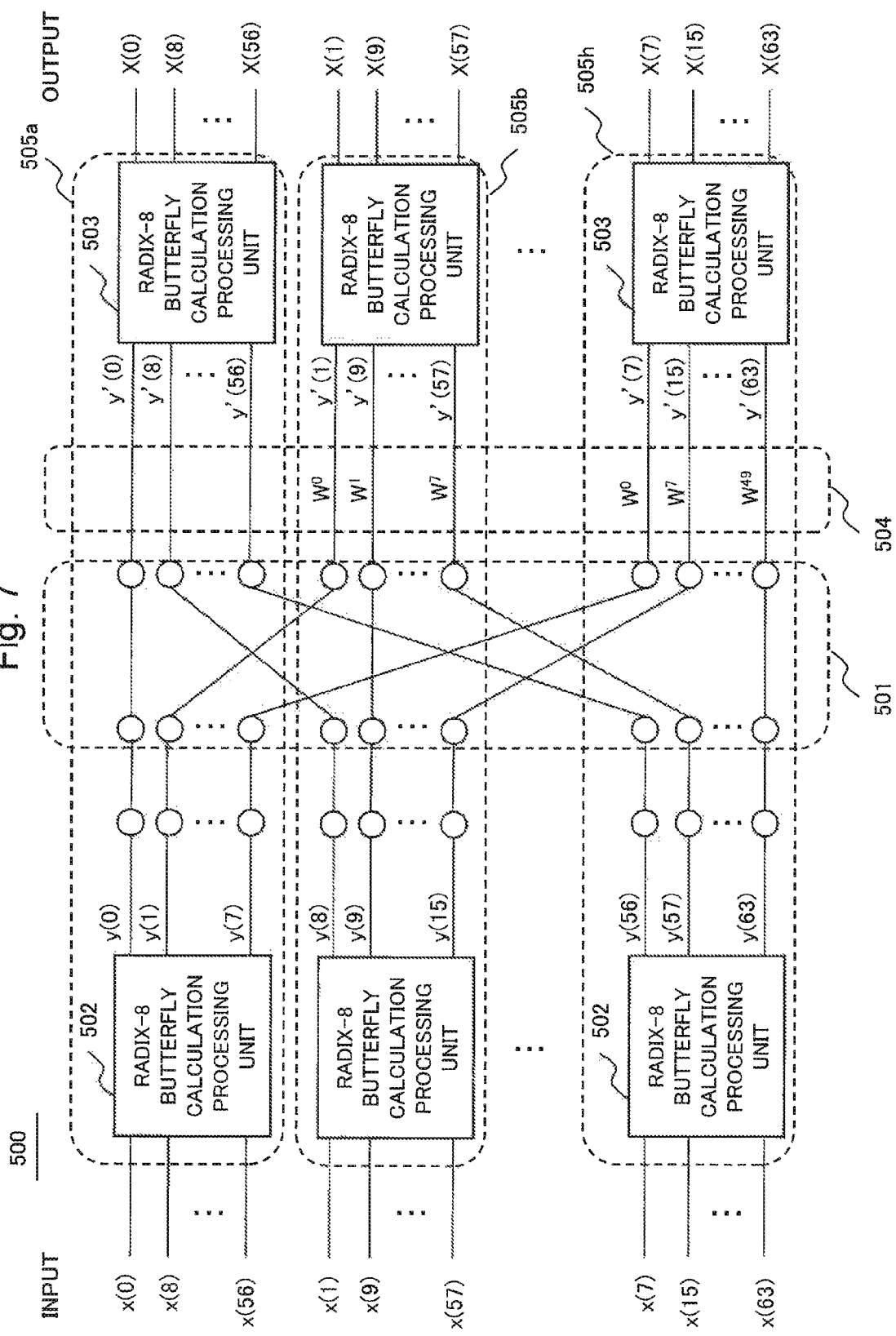
FIG. 7 is a diagram illustrating a data flow 500 of 64-point FFT processing using two-stage butterfly calculation.
Figure 8:
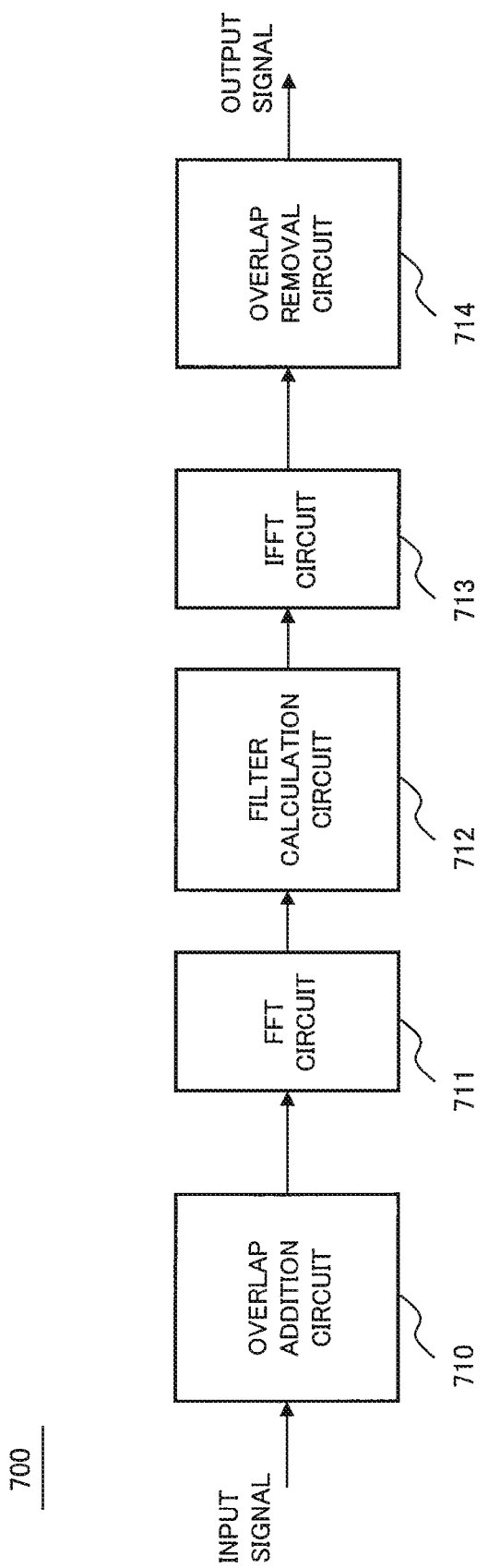
FIG. 8 is a block diagram illustrating a configuration of an FFT circuit 700.

An enormous circuit scale is required in order to provide the entire 64-point FFT processing illustrated in the data flow in FIG. 7, that is, processing of eight data sets respectively including eight pieces of data, by a separate circuit for each set. Consequently, the FFT circuit 211 is assumed to perform the 64-point FFT processing in 8-data-parallel. In this case, the FFT circuit 211 inputs time-domain data x(n), and generates and outputs a frequency-domain signal X(k) Fourier-transformed by FFT processing. At this time, a total of 64 pieces of data are input as input data x(n) by eight pieces of data in a period of eight cycles in an order illustrated in FIG. 3. Note that numbers from 0 to 63 indicated as contents of the table in FIG. 3 denote an index n of x(n).

Specifically, eight pieces of data x(0), x(1), ..., x(7) composing a data set P1 are input in the first cycle. Then eight pieces of data x(8), x(9), ..., x(15) composing a data set P2 are input in the second cycle. Thereafter, data composing data sets P3 to P8 are similarly input in the third to eighth cycles, respectively.

Similarly, 64 pieces of data are output as output data X(k) by eight pieces of data in a period of eight cycles in an order illustrated in FIG. 3. Note that numbers 0 to 63 indicated as contents of the table in FIG. 3 denote an index k of X(k).

Specifically, eight pieces of data X(0), X(1), ..., X(7) composing a data set P1 are output in the first cycle. Eight pieces of data X(8), X(9), ..., X(15) composing a data set P2 are output in the second cycle. Thereafter, data composing data sets P3 to P8 are similarly output in the third to eighth cycles, respectively.

The FFT circuit 211 includes a first data sorting processing unit 11, a first butterfly calculation processing unit 21, a second data sorting processing unit 12, a twiddle multiplication processing unit 31, a second butterfly calculation processing unit 22, and a third data sorting processing unit 13. The FFT circuit 211 performs pipeline processing on first data sorting processing, first butterfly calculation processing, second data sorting processing, twiddle multiplication processing, second butterfly calculation processing, and third data sorting processing.

The first data sorting processing unit 11 and the second data sorting processing unit 12 are buffer circuits for data sorting. The first data sorting processing unit 11 and the second data sorting processing unit 12 perform sorting of data sequences based on data dependence in an FFT processing algorithm, before and after the first butterfly calculation processing unit 21, respectively.

Similarly, the third data sorting processing unit 13 is also a buffer circuit for data sorting. In other words, the third data sorting processing unit 13 performs sorting of data sequences based on data dependence in an FFT processing algorithm, after the second butterfly calculation processing unit 22.

Specifically, the first data sorting processing unit 11 sorts a "sequential order" illustrated in FIG. 3, which is an input order of input data x(n), into a "bit-reversed order" illustrated in FIG. 4, which is an order of input to the first butterfly calculation processing unit 21.

The bit-reversed order illustrated in FIG. 4 corresponds to a data set input to radix-8 butterfly processing 502 in the first stage in the data flow diagram illustrated in FIG. 7. Specifically, eight pieces of data x(0), x(8), ..., x(56) composing a data set P1 are input in the first cycle. Then, eight pieces of data x(1), x(9), ..., x(57) composing a data set P2 are input in the second cycle. Thereafter, data composing data sets P3 to P8 are similarly input in the third to eighth cycles, respectively.

The "sequential order" and the "bit-reversed order" will be specifically described herein. The "sequential order" refers to an order of eight data sets P1, P2, P3, P4, P5, P6, P7, and P8 illustrated in FIG. 3. Each data set Ps (where s denotes a value indicating an order of a processing cycle: s=1, ..., 8) is composed of eight pieces of data arranged in an order of ps(0) to ps(7) where ps(i) is expressed as ps(i)=8(s−1)+i. Further, each data set is arranged in an order of P1, P2, P3, P4, P5, P6, P7, and P8 corresponding to progression of processing cycles. In other words, the sequential order represents creating s sets of data sets by taking every i pieces of data from the leading data out of i×s pieces of data and arranging the data in order of data, and then arranging the data sets in order of cycle.

The "bit-reversed order" refers to an order of eight data sets Q1, Q2, Q3, Q4, Q5, Q6, Q7, and Q8 illustrated in FIG.

4. Each data set Qs is composed of eight pieces of data from qs(0) to qs(7), where qs(i) is expressed as $$qs(i)=(s-1)+8i.$$

Further, each data set is arranged in an order of Q1, Q2, Q3, Q4, Q5, Q6, Q7, and Q8 corresponding to progression of processing cycles. In other words, the bit-reversed order represents arranging every s pieces of data from the leading data in order of cycle out of i×s pieces of data input in the sequential order, and then arranging i pieces of data in a same cycle as a set in order of data.

As described above, each data set in the bit-reversed order is uniquely determined once each set in the sequential order is set. An i-th piece of data of the data composing each data set Qs (s=1, ... , 8) in the bit-reversed order is an s-th piece of data of the data in a cycle i conforming to the sequential order. In other words, the following expression holds:

$$Qs(i)=Pi(s)$$

Thus, Qs(i) and Pi(s) have a relation of interchanging an order corresponding to progression of cycles and an order corresponding to data positions with respect to data composing each data set. Therefore, sorting data input in the bit-reversed order in accordance with the bit-reversed order results in the data arranged in the sequential order.

Each row ps(i) in FIG. 3 and eight rows qs(i) in FIG. 4 respectively represent data input to an i-th piece of data in a next stage. Each of eight numbers included in each data set represents identification information specifying one of FFT points, and specifically is a value of an index n of x(n).

Note that the sequential order and the bit-reversed order are not limited to the exemplifications in FIGS. 3 and 4. In other words, each data set in a sequential order may be created by arranging data sequentially in accordance with a number of FFT points, a number of cycles, and a number of pieces of data processed in parallel, as described above. Further, each data set in a bit-reversed order may be created by interchanging an order corresponding to progression of cycles and an order corresponding to data positions with respect to data input in a sequential order as described above.

The first butterfly calculation processing unit 21 is a butterfly circuit processing the first-stage butterfly calculation processing 502 (first butterfly calculation processing) of radix-8 butterfly calculation processing performed twice in the data flow 500 in FIG. 7. The first butterfly calculation processing unit 21 outputs the result of butterfly calculation processing as data y(n) (n=0, 1, ... , 63) in the sequential order illustrated in FIG. 3.

The second data sorting processing unit 12 sorts data y(n), output from the first butterfly calculation processing unit 21 in the sequential order, into the bit-reversed order illustrated in FIG. 4 to be input to the second butterfly calculation processing unit 22.

The twiddle multiplication processing unit 31 is a circuit processing complex rotation in a complex plane in FFT calculation after the first butterfly calculation processing, corresponding to twiddle multiplication processing 504 in the data flow 500 in FIG. 7. Note that data sorting is not performed in the twiddle multiplication processing.

The second butterfly calculation processing unit 22 is a butterfly circuit processing second-stage radix-8 butterfly processing 503 in the data flow diagram in FIG. 7. The second butterfly calculation processing unit 22 performs butterfly calculation processing on data y'(n) (n=0, 1, ... , 63) after the twiddle multiplication processing input in the bit-reversed order, and outputs the result X(k) (n=0, 1, ... , 63) also in the bit-reversed order.

The third data sorting processing unit 13 sorts data X(k), output from the second butterfly calculation processing unit 22 in the bit-reversed order, into the sequential order illustrated in FIG. 3.

The data sorting processing units provide data sorting processing in accordance with each of the sequential order illustrated in FIG. 2, the bit-reversed order illustrated in FIG. 3, and the sequential order illustrated in FIG. 4, by temporarily storing input data and controlling selection and output of the stored data. A specific example of the data sorting processing units will be described below.

Figure 5:
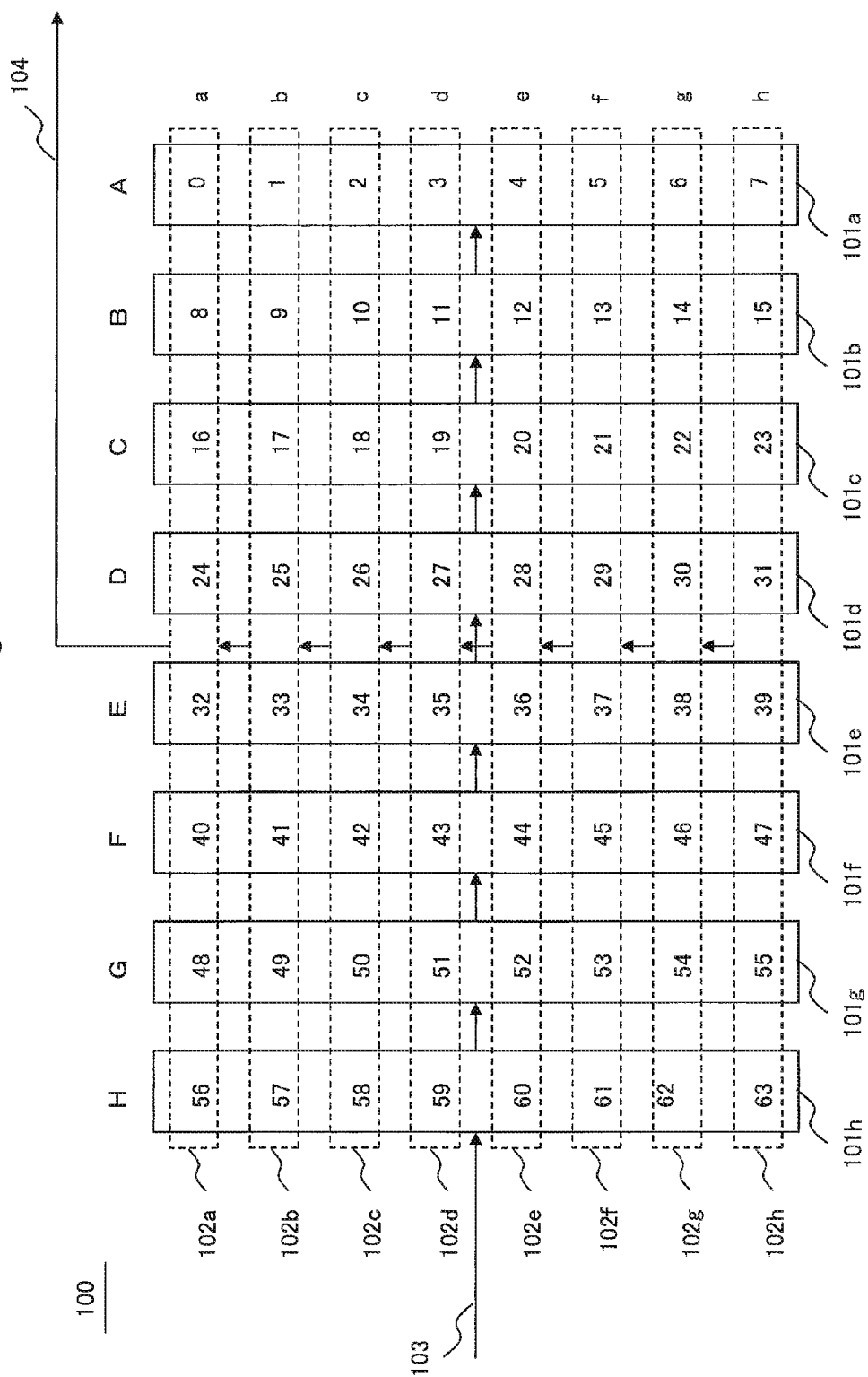
FIG. 5 is a block diagram illustrating a configuration example 100 of a data sorting processing unit according to the exemplary embodiment of the present invention.

The first data sorting processing unit 11, the second data sorting processing unit 12, and the third data sorting processing unit 13 may be provided by, for example, a data sorting processing unit 100 illustrated in FIG. 5.

The data sorting processing unit 100 inputs data sets D1 to D8 composed of eight pieces of data input as input information 103 in a first-in order in a first-in first-out buffer (FIFO buffer), writes the data sets into data storage locations 101a to 101h, and stores the data sets. Specifically, the data sets D1 to D8 are stored in the data storage locations 101a to 101h, respectively.

Next, the data sorting processing unit 100 outputs the stored data in a first-out order in a FIFO buffer. Specifically, the data sorting processing unit 100 reads eight pieces of data from each of data read locations 102a to 102h to compose a data set, and outputs eight data sets D1' to D8' as output information 104. Thus, each of the data sets D1' to D8' is composed as a set by sorting data, included in the data sets D1 to D8 arranged in order of cycle, into order of data position.

As described above, three sets of sorting processing conforming to the sequential order illustrated in FIG. 2, the bit-reversed order illustrated in FIG. 3, and the sequential order illustrated in FIG. 4 by the first data sorting processing unit 11, the second data sorting processing unit 12, and the third data sorting processing unit 13, respectively, are required in the FFT circuit 211. The reason is that the FFT circuit 211 performs 64-point FFT processing in 8-data-parallel, and therefore requires eight cycles for FFT processing and further requires data sorting across the cycles.

The IFFT circuit 213 may be provided by a similar configuration to the FFT circuit 211.

Next, a configuration of the overlap error detection unit 215 included in the digital filter circuit 200 will be described.

Figure 6:
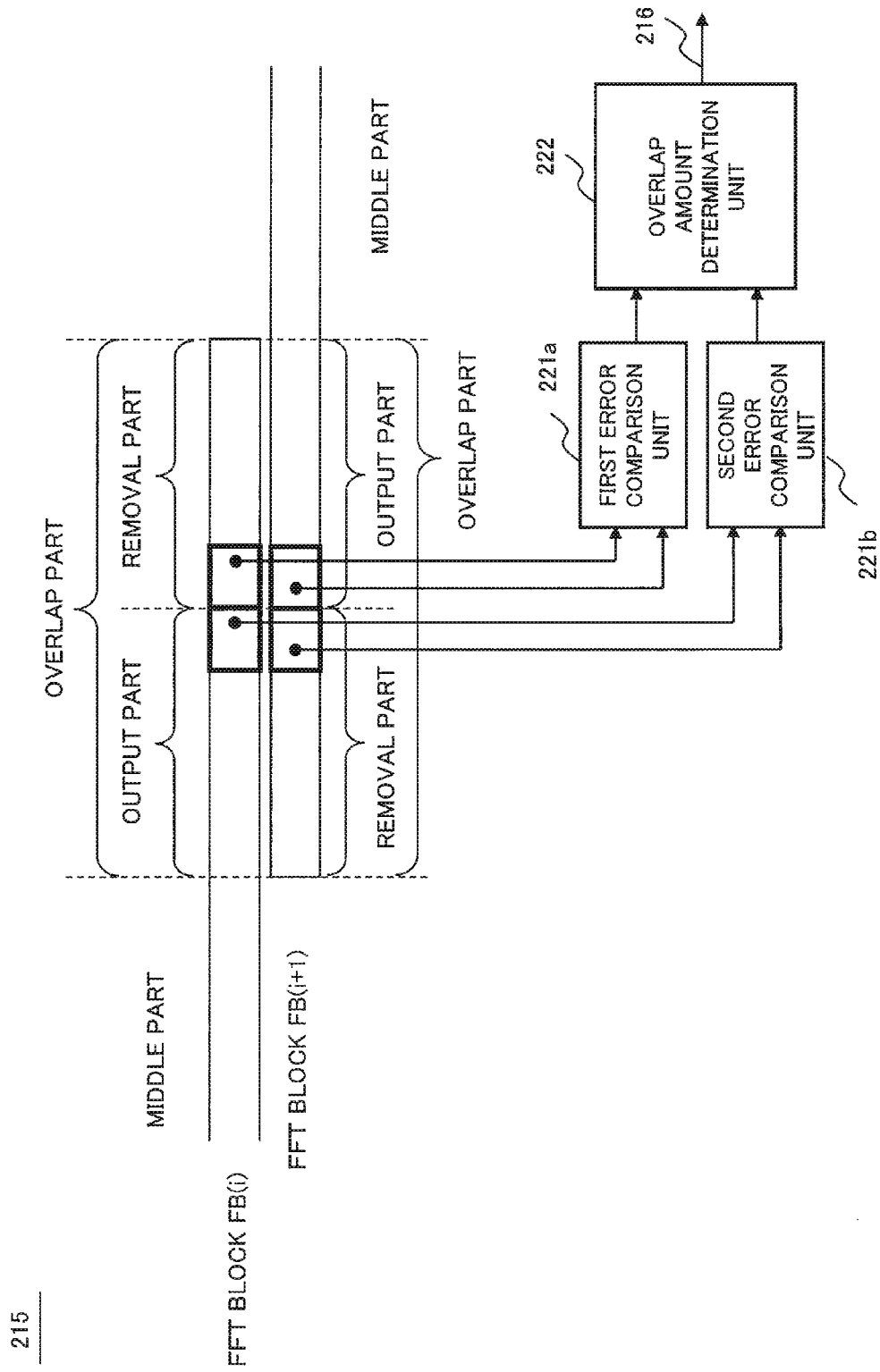
FIG. 6 is a block diagram illustrating a configuration of an overlap error detection unit 215 according to the exemplary embodiment of the present invention.

FIG. 6 is a block diagram illustrating a configuration example of the overlap error detection unit 215 according to the exemplary embodiment of the present invention. The overlap error detection unit 215 includes a first error comparison unit 221a, a second error comparison unit 221b, and an overlap amount determination unit 222.

The overlap error detection unit 215 compares removal data with overlap output data, both included in each of an FFT block FB(i) and an FFT block FB(i+1) being two consecutive FFT blocks, and determines an overlap amount M, in accordance with the result. A detailed operation of the overlap error detection unit 215 is as follows.

The first error comparison unit 221a detects an error in removal part data in the FB(i) by comparing values of removal part data in the FB(i) with values of output part data in the FB(i+1), and outputs the detected error to the overlap amount determination unit 222.

Similarly, the second error comparison unit 221b detects an error in removal part data in the FB(i+1) by comparing values of output part data in the FB(i) with values of removal part data in the FB(i+1), and outputs the detected error to the overlap amount determination unit 222.

The overlap amount determination unit 222 determines a required overlap amount, in accordance with the error in the removal part data of the FB(i) input from the first error comparison unit 221a and the error in the removal part data in the FB(i+1) input from the second error comparison unit 221b. Then, the overlap amount determination unit 222 outputs the control signal 216 instructing increase or decrease of the overlap amount to the overlap addition circuit 210 and the overlap removal circuit 214.

(Operation of Exemplary Embodiment)

By mutually comparing values of removal part data with values of output part data in an overlap part of two consecutive FFT blocks, the overlap error detection unit 215 detects a distortion amount in the overlap part. The reason the distortion amount of the overlap part is detected by the comparison is that data in the output part have normal values not causing distortion while data in the removal part may cause distortion.

The overlap error detection unit 215 increases an overlap amount M when the detected distortion amount is greater than a predetermined value. The overlap amount determination unit 215 decreases the overlap amount M when the detected distortion amount is less than a predetermined value. For that purpose, the overlap error detection unit 215 outputs the control signal 216 instructing increase or decrease of the overlap amount to the overlap addition circuit 210 and the overlap removal circuit 214.

When the control signal 216 output from the overlap amount determination unit 215 instructs to decrease an overlap amount, the overlap addition circuit 210 and the overlap removal circuit 214 decrease the overlap amount M. By contrast, when the control signal 216 instructs to increase an overlap amount, the overlap addition circuit 210 and the overlap removal circuit 214 increase the overlap amount M. Then, the overlap addition circuit 210 and the overlap removal circuit 214 respectively adds or removes an overlap, in accordance with the overlap amount M.

(Effect of Exemplary Embodiment)

Data causing signal distortion are included near both ends of an overlap part in an FFT-processed block. Further, an amount of the distortion is large when an actual overlap amount M is less than a required overlap amount and small when the overlap amount M is greater. Further, as the overlap amount M becomes greater, a total processing amount increases and, consequently, power consumption of the digital filter circuit 200 increases as well.

Hence, by comparing data in an overlap part of two consecutive FFT blocks, the digital filter circuit 200 according to the present exemplary embodiment detects an amount of distortion caused in the overlap part, as described above. Then, the digital filter circuit 200 increases the value of the overlap amount M when the detected distortion amount is greater than a predetermined value, and decreases the value of the overlap amount M when the detected distortion amount is less. In other words, the digital filter circuit 200 adaptively controls the overlap amount M, in accordance with magnitude of the detected distortion in the overlap part.

Consequently, the present exemplary embodiment is able to maintain a distortion amount caused by output data of the digital filter circuit 200 at a proper amount. Additionally, the present exemplary embodiment performs filter processing with a minimum overlap amount required for maintaining the proper distortion amount, and therefore is able to reduce power consumption required for filter processing.

Further, the overlap amount determination unit 222 according to the present exemplary embodiment includes two error comparison units in order to detect an error in removal part data in a former block and a latter block of two consecutive FFT blocks, respectively, and determines an overlap amount. The overlap amount determination unit 222 may include only an error comparison unit detecting an error in removal part data in either the former block or the latter block, and determine a required overlap amount only from the output of the error comparison unit.

Further, it is assumed that each set of processing according to the present exemplary embodiment such as FFT, IFFT, and filter processing is processed by a separate component such as a circuit. However, each set of processing according to the exemplary embodiment may be performed by a computer included in a given device, such as software using a digital signal processor (DSP) and the like. In other words, a computer program performing each set of processing is read and executed by a DSP (not illustrated).

For example, data sorting processing may be performed by use of a program. In other words, data sorting processing may be performed by a program controlling data writing to a memory and data reading from a memory by use of a DSP and a memory. Further, FFT processing according to the present exemplary embodiment may be performed by use of a program.

Performing each set of processing by use of a program as described above still provides similar processing to the processing according to the aforementioned exemplary embodiment.

Additionally, the processing program described above may be stored in a semiconductor storage device such as a read only memory (ROM), a random access memory (RAM), and a flash memory, or a nontemporary medium such as an optical disk, a magnetic disk, and a magneto-optical disk.

This application is based upon and claims the benefit of priority from Japanese patent application No. 2013-258272, filed on Dec. 13, 2013, the disclosure of which is incorporated herein in its entirety by reference.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

REFERENCE SIGNS LIST

11 First data sorting processing unit
12 Second data sorting processing unit
13 Third data sorting processing unit
21 First butterfly calculation processing unit
22 Second butterfly calculation processing unit
31 Twiddle multiplication processing unit
100 Data sorting processing unit
101a to 101h Data storage location
102a to 102h Data read location
103 Input information
104 Output information
200 Digital filter circuit
210 Overlap addition circuit
211 FFT circuit
212 Filter calculation circuit
213 IFFT circuit
214 Overlap removal circuit 215 Overlap error detection unit
216 Control signal
221a First error comparison unit
221b Second error comparison unit
222 Overlap amount determination unit
500 Data flow
501 Data sorting processing
502, 503 Butterfly calculation processing
504 Twiddle multiplication processing
505a to 505h Partial data flow
700 Digital filter circuit
710 Overlap addition circuit
711 FFT circuit
712 Filter calculation circuit
713 IFFT circuit

What is claimed is:

1. A digital filter device comprising:
an overlap addition unit for adding an overlap amount which is last M consecutive pieces of data in a second input block including N consecutive pieces of time-domain input data immediately preceding a first input block to the first input block including (N−M) consecutive pieces of time-domain input data (where N is a positive integer and M is a positive integer less than N), to generate an overlap block;
a Fourier transform unit for transforming the overlap block and the second input block into a first frequency-domain block and a second frequency-domain block in a frequency domain, respectively, by fast Fourier transform processing;
a filter calculation unit for performing filter processing on the first frequency-domain block and the second frequency-domain block, to generate a first after-processing block and a second after-processing block, respectively;
an inverse Fourier transform unit for transforming the first after-processing block and the second after-processing block into a first time-domain block and a second time-domain block in a time domain, respectively, by inverse fast Fourier transform processing;
an overlap removal unit for, out of an overlap part in which each of the first time-domain block and the second time-domain block overlaps temporally, removing k pieces of data (where k is a positive integer less than M) at a front end of a time axis of the first time-domain block and (M−k) pieces of data at a rear end of a time axis of the second time-domain block as removal part data, to generate output data; and
an overlap error detection unit for comparing the removal part data in the first time-domain block with output part data other than the removal part data in the overlap part in the second time-domain block, to detect a distortion amount caused by data included in the overlap part, and controlling the overlap amount, in accordance with the distortion amount.

2. The digital filter device according to claim 1, wherein the overlap error detection unit
increases the overlap amount when the detected distortion amount is greater than a predetermined value, and
decreases the overlap amount when the detected distortion amount is less than a predetermined value.

3. The digital filter device according to claim 1, wherein the overlap error detection unit includes
a first error comparison unit comparing the removal part data in the first time-domain block with the output part data in the second time-domain block, to detect the distortion amount of the first time-domain block, and
an overlap amount determination unit determining the overlap amount, in accordance with a distortion amount detected by the first error comparison unit.

4. The digital filter device according to claim 3, wherein
the overlap error detection unit includes a second error comparison unit comparing the removal part data in the second time-domain block with the output part data in the first time-domain block, to detect the distortion amount of the second time-domain block, and
the overlap amount determination unit determines the overlap amount, in accordance with a distortion amount detected by the second error comparison unit.

5. A digital filter processing method comprising:
adding an overlap amount which is last M consecutive pieces of data in a second input block including N consecutive pieces of time-domain input data immediately preceding a first input block to the first input block including (N−M) consecutive pieces of time-domain input data (where N is a positive integer and M is a positive integer less than N), to generate an overlap block;
transforming the overlap block and the second input block into a first frequency-domain block and a second frequency-domain block in a frequency domain, respectively, by fast Fourier transform processing;
performing filter processing on the first frequency-domain block and the second frequency-domain block, to generate a first after-processing block and a second after-processing block, respectively;
transforming the first after-processing block and the second after-processing block into a first time-domain block and a second time-domain block in a time domain, respectively, by inverse fast Fourier transform processing;
out of an overlap part in which each of the first time-domain block and the second time-domain block overlaps temporally, removing k pieces of data (where k is a positive integer less than M) at a front end of a time axis of the first time-domain block and (M−k) pieces of data at a rear end of a time axis of the second time-domain block as removal part data, to generate output data; and
comparing the removal part data in the first time-domain block with output part data other than the removal part data in the overlap part in the second time-domain block, to detect a distortion amount caused by data included in the overlap part, and controlling the overlap amount, in accordance with the distortion amount.

6. A storage medium having a digital filter program stored thereon, the program causing a computer included in a digital filter device to function as:
an overlap addition unit for adding an overlap amount which is last M consecutive pieces of data in a second input block including N consecutive pieces of time-domain input data immediately preceding a first input block to the first input block including (N−M) consecutive pieces of time-domain input data (where N is a positive integer and M is a positive integer less than N), to generate an overlap block;
a Fourier transform unit for transforming the overlap block and the second input block into a first frequency-domain block and a second frequency-domain block in a frequency domain, respectively, by fast Fourier transform processing;
a filter calculation unit for performing filter processing on the first frequency-domain block and the second frequency-domain block, to generate a first after-processing block and a second after-processing block, respectively;
an inverse Fourier transform unit for transforming the first after-processing block and the second after-processing block into a first time-domain block and a second time-domain block in a time domain, respectively, by inverse fast Fourier transform processing;
an overlap removal unit for, out of an overlap part in which each of the first time-domain block and the second time-domain block overlaps temporally, removing k pieces of data (where k is a positive integer less than M) at a front end of a time axis of the first time-domain block and (M−k) pieces of data at a rear end of a time axis of the second time-domain block as removal part data, to generate output data; and
an overlap error detection unit for comparing the removal part data in the first time-domain block with output part data other than the removal part data in the overlap part in the second time-domain block, to detect a distortion amount caused by data included in the overlap part, and controlling the overlap amount, in accordance with the distortion amount.

* * * * *